United States Patent
Park

(10) Patent No.: US 8,466,030 B2
(45) Date of Patent: Jun. 18, 2013

(54) SEMICONDUCTOR DEVICE AND FABRICATING METHOD THEREOF

(75) Inventor: Jin Ha Park, Echeon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 1088 days.

(21) Appl. No.: 11/980,528

(22) Filed: Oct. 31, 2007

(65) Prior Publication Data

US 2008/0122017 A1 May 29, 2008

(30) Foreign Application Priority Data

Nov. 24, 2006 (KR) .................. 10-2006-0116778

(51) Int. Cl.
*H01L 29/78* (2006.01)
*H01L 21/336* (2006.01)

(52) U.S. Cl.
USPC ............ 438/303; 438/306; 438/142; 257/408

(58) Field of Classification Search
USPC ................. 257/213, 256, 288, 289, 290, 296, 257/295, 314, 327, 347, 364, 365, 367, 368, 257/408, 410, 412; 438/142–308
See application file for complete search history.

(56) References Cited

U.S. PATENT DOCUMENTS

| 5,648,287 A | * | 7/1997 | Tsai et al. .................. 438/305 |
| 5,972,760 A | * | 10/1999 | Ju .............................. 438/305 |
| 6,162,692 A | * | 12/2000 | Gardner et al. .............. 438/301 |
| 6,743,689 B1 | * | 6/2004 | Paton et al. ................. 438/305 |
| 2003/0227054 A1 | * | 12/2003 | Saiki ........................... 257/345 |
| 2004/0005748 A1 | * | 1/2004 | Hyun et al. .................. 438/197 |

FOREIGN PATENT DOCUMENTS

| KR | 10-2004-0049903 | * | 6/2004 |
| KR | 2004049903 | * | 6/2004 |
| KR | 10-2005-0069636 | * | 7/2005 |

OTHER PUBLICATIONS

Office Action issued on Mar. 27, 2008 from the Korean Patent Office in a related Korean patent application No. 10-2006-0116778.
Jeong, M. H., "Transistor of Semiconductor Device and Forming Method Thereof, Capable of Preventing Dopants of Gate Layer and Source and Drain Regions From Diffusing Into Unwanted Portion," Korean Patent Abstracts, Publication No. 1020050069636, Published on Jul. 5, 2005, 1 page.

* cited by examiner

*Primary Examiner* — Asok K Sarkar
*Assistant Examiner* — Dmitriy Yemelyanov
(74) *Attorney, Agent, or Firm* — Finnegan Henderson Farabow Garrett & Dunner LLP

(57) ABSTRACT

A semiconductor device, such as a positive channel metal-oxide semiconductor (PMOS) transistor, and a fabricating method thereof are provided. The semiconductor device includes: a gate insulation layer and a gate electrode, a semiconductor substrate, a spacer formed on side walls of the gate insulation layer and the gate electrode, a lightly doped drain (LDD) area formed on the semiconductor substrate at both sides of the gate electrode, a source/drain area formed on the semiconductor substrate at both sides of the gate electrode, and an oxide-nitride layer formed on the gate electrode and on the source/drain area.

8 Claims, 6 Drawing Sheets

SEMICONDUCTOR DEVICE AND FABRICATING METHOD THEREOF

The present application claims the benefit of priority under 35 U.S.C. 119 to Korean Patent Application No. 10-2006-0116778, filed on Nov. 24, 2006, the entire contents of which are incorporated herewith by reference.

BACKGROUND

The present invention relates to a semiconductor device, such as a positive channel metal-oxide-semiconductor (PMOS) transistor, and a fabricating method thereof.

FIG. 1A is a cross-sectional view of a positive channel metal-oxide-semiconductor (PMOS) transistor illustrating a source/drain impurity ion implantation process according to the related art. FIG. 1B is a cross-sectional view of a PMOS transistor illustrating an annealing process after the source/drain impurity ion implantation process according to the related art.

The PMOS transistor according to the related art is formed as follows. At first, a shallow trench isolation (STI) layer 101 is formed on a semiconductor substrate 100, such as a silicon substrate, in order to isolate semiconductor devices from one another, as shown in FIG. 1A. Then, an implantation process is performed to form an N-well 121 on semiconductor substrate 100.

After a gate insulation layer 123, made of a silicon oxide layer, is formed on semiconductor substrate 100, a poly silicon layer is deposited on gate insulation layer 123 to form a gate electrode 125. The poly silicon layer and the silicon oxide layer formed on a gate area of semiconductor substrate 100 are patterned through a photolithography process and an etching process by forming a patterned photoresist layer (not shown) on the poly silicon layer. That is, gate electrode 125 and gate insulation layer 123 are formed by etching, except the gate area, the poly silicon layer and the silicon oxide layer formed on semiconductor substrate 100 using the patterned photoresist layer as an etching mask.

A lightly doped drain (LDD) area 127 is formed in active areas at both sides of gate electrode 125 on semiconductor substrate 100 by implanting low-density impurities.

An insulation layer is formed on the entire surface of semiconductor substrate 100 to cover gate electrode 125. A spacer 131 is formed on side walls of gate electrode 125 and gate insulation layer 123 by etching the insulation layer. A source/drain area 133 is formed at both sides of spacer 131 on semiconductor substrate 100 by ion-implanting high density impurities.

Spacer 131 may be made of a nitride layer. In addition, a tetra ethyl ortho silicate (TEOS) 129 may be formed at the bottom of the nitride layer.

In order to form source/drain area 133 in the PMOS transistor, high density impurities, such as Boron ions, may be used.

Recently, the junction depth of source/drain area 133 has been reduced from about 90 nm to about 20 nm in the impurity ion implantation process for forming source/drain area 133 of the PMOS transistor. In order to satisfy such a reduced junction depth, the implantation process needs to be performed at a low energy of about 1 KeV to 5 KeV.

Since Boron (B) ions have a high diffusivity, in an annealing process for activating the high density Boron ions in source/drain area 133, Boron ions may be out-diffused even if the ion implantation process is performed with a low ion implantation energy. The speed of the PMOS transistor thus becomes slower, because the out-diffused Boron ions prevent the impurities to be ion-implanted in source/drain area 133 from reaching a desired implantation level.

SUMMARY

Embodiments consistent with the present invention provide a semiconductor device with improved characteristics by preventing impurities from out-diffused in the junction area of, for example, a PMOS transistor, and a fabricating method thereof.

In one embodiment a semiconductor device includes: a gate insulation layer formed on a predetermined area of a semiconductor substrate; a gate electrode formed on the gate insulation layer; a lightly doped drain (LDD) area formed on the semiconductor substrate at both sides of the gate electrode by implanting low density impurities in the semiconductor substrate using the gate electrode as a mask; a spacer formed on side walls of the gate insulation layer and the gate electrode; a source/drain area formed on the semiconductor substrate at both sides of the gate electrode by implanting high density impurities in the semiconductor substrate using the gate electrode and the spacer as a mask; and an oxide-nitride layer formed on the gate electrode and the source/drain area.

In another embodiment, a method for fabricating a semiconductor device includes: forming a gate insulation layer and a gate electrode at predetermined areas of a semiconductor substrate; forming low density impurity areas at both sides of the gate electrode on the semiconductor substrate; forming a spacer at side walls of the gate insulation layer and the gate electrode; forming a thermal oxide layer on an exposed portion of the semiconductor substrate and on the gate electrode; forming a source/drain area on the semiconductor substrate by implanting high density impurities at both sides of the gate electrode using the gate electrode and the spacer as an implantation mask; forming an oxide/nitride layer on the semiconductor substrate by processing the thermal oxide layer with an nitrogen plasma process; and performing an annealing process for activating the impurities.

DETAILED DESCRIPTION

Figure 1A:
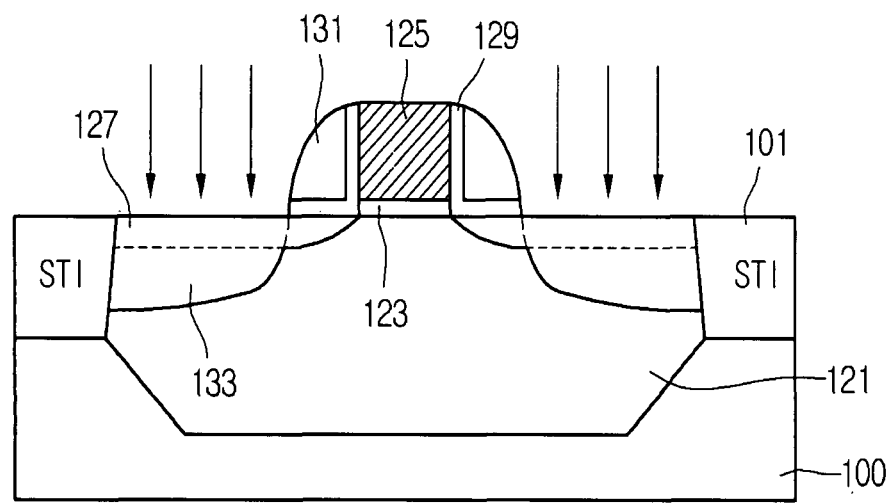
FIG. 1A is a cross-sectional view of a positive channel metal-oxide-semiconductor (PMOS) transistor illustrating a source/drain impurity ion implantation process according to the related art.
Figure 1B:
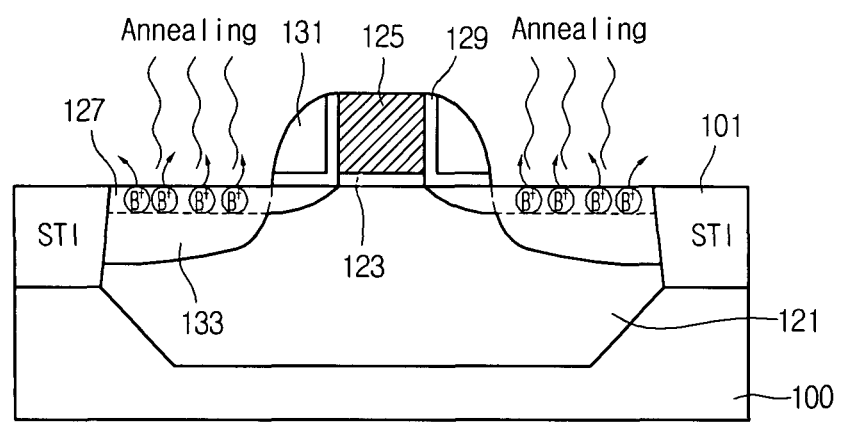
FIG. 1B is a cross-sectional view of a PMOS transistor illustrating an annealing process after the source/drain impurity ion implantation process according to the related art.
Figure 2:
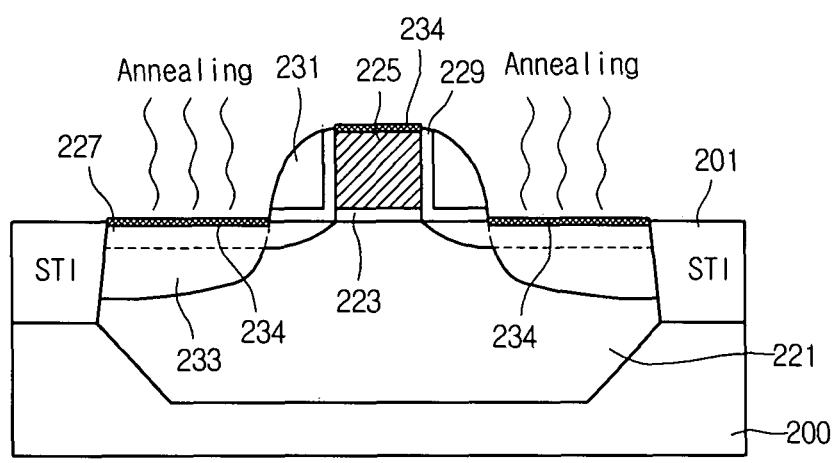
FIG. 2 is a cross-sectional view of a semiconductor device including a PMOS transistor, according to an embodiment consistent with the present invention.

FIG. 2 is a cross-sectional view of a semiconductor device, according to an embodiment consistent with the present invention. In one embodiment, the semiconductor device may be a PMOS transistor. As shown in FIG. 2, the PMOS transistor includes a device isolation layer 201 formed on a semiconductor substrate 200 to define an active area.

Semiconductor substrate 200 may be a silicon substrate 200, and device isolation layer 201 may be formed using a shallow trench isolation (STI) process. It is also possible to form device isolation layer 201 by a local oxidation of silicon (LOCOS) process.

An N-well 221 is formed on semiconductor substrate 200 by implanting N type impurities in the active area.

A gate insulation layer 223 and a gate electrode 225 are formed in the active area on semiconductor substrate 200. Gate insulation layer 223 may comprise silicon oxide, and gate electrode 225 may comprise poly silicon.

Spacers 229 and 231 are formed at side walls of gate electrode 225 and gate insulation layer 223. Spacers 229 and 231 may comprise an insulation material, such as tetra ethyl ortho silicate (TEOS) and silicon nitride ($SiN_x$).

A P type lightly doped drain (P-LDD) area 227 is formed by implanting P type impurities in the active area at both sides of gate electrode 225 on semiconductor substrate 200.

Also, a source/drain area 233 is formed in semiconductor substrate 200 by implanting high density P type impurities using spacers 231 and 229 as a mask.

A silicon oxide nitride (SiON) layer 234 is formed on gate electrode 225 and source/drain area 233. SiON layer 234 prevents the P type impurities, which may comprise, for example, Boron ions, from out-diffused in an annealing process for activating ions after implanting high density P type impurities for forming source/drain area 233. Boron ions having 11 AMU (atomic mass unit) may be implanted in semiconductor substrate 200 to form source/drain area 233.

FIGS. 3A to 3I are cross-sectional views illustrating a method for fabricating a semiconductor device, according to an embodiment consistent with the present invention.

Figure 3A:
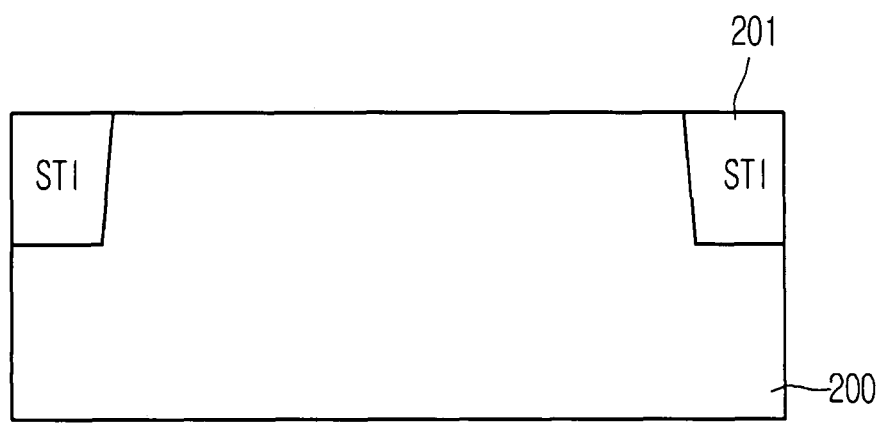
FIGS. 3A to 3I are cross-sectional views illustrating a method for fabricating a semiconductor device, according to an embodiment consistent with the present invention.

A device isolation layer 201 is formed on a semiconductor substrate 200, such as a silicon substrate 200, through a shallow trench isolation (STI) process, as shown in FIG. 3A, so as to define an active area between device isolation layers 201. The semiconductor device may be formed in the active area isolated and defined by device isolation layer 201.

Figure 3B:
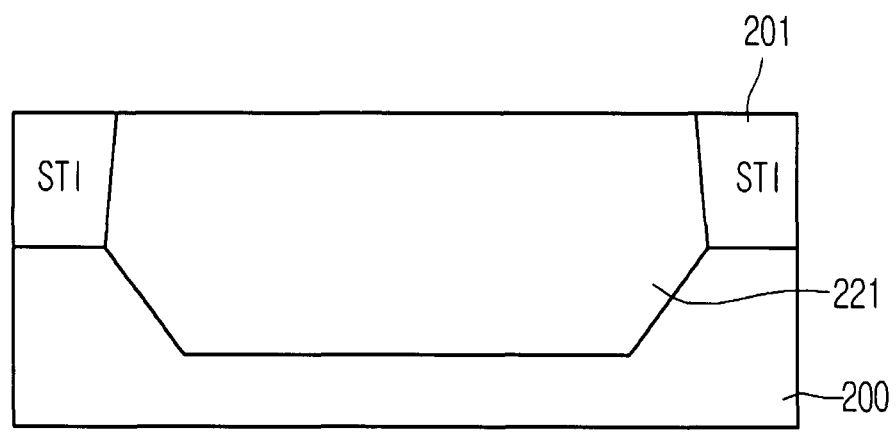

Then, an N-well 221 is formed by implanting N type impurities in semiconductor substrate 200, as shown in FIG. 3B.

A silicon oxide layer is formed on semiconductor substrate 200 through a thermal oxidation process, and a polysilicon layer is deposited on the silicon oxidation layer.

Figure 3C:
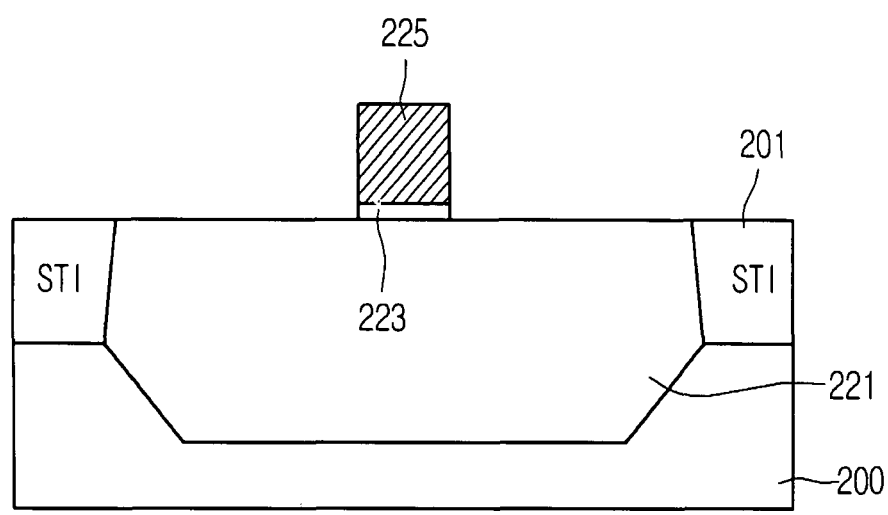

As shown in FIG. 3C, a gate stack formed of gate electrode 225 and gate insulation layer 223 is formed by performing a lithography process and an etching process on the silicon oxidation layer formed on semiconductor substrate 200 and the poly silicon layer formed on the silicon oxidation layer.

Figure 3D:
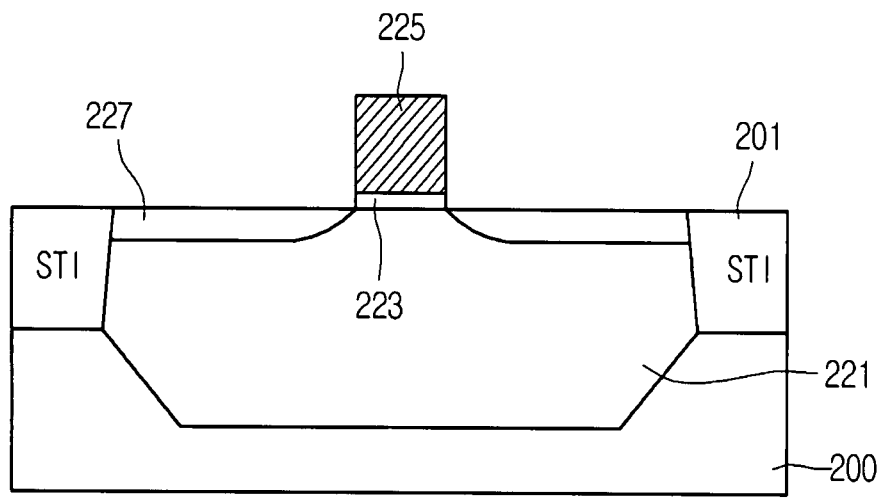

As shown in FIG. 3D, low density P type impurities are implanted using gate electrode 225 as an implantation mask. As a result, a P-LDD area 227 is formed at both sides of gate electrode 225 on semiconductor substrate 200.

Figure 3E:
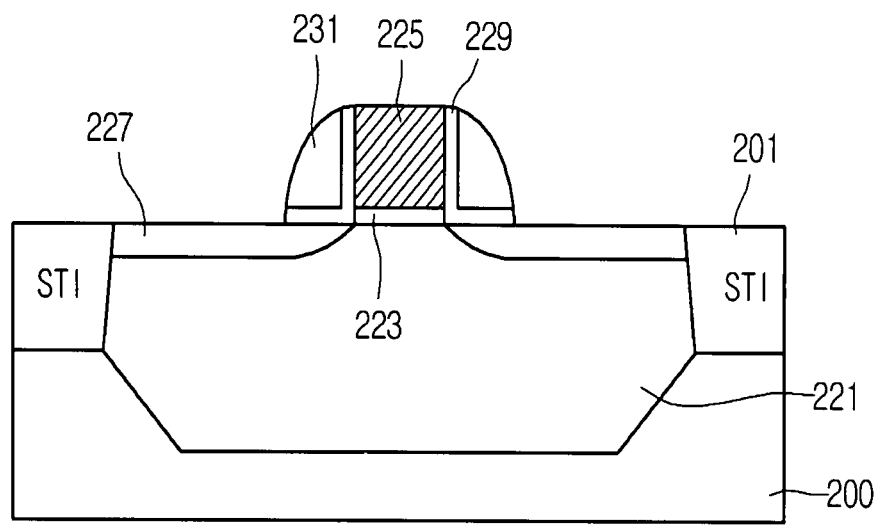

As shown in FIG. 3E, an insulation layer, such as a nitride layer or an oxide/nitride layer, is formed on the entire surface of semiconductor substrate 200 to cover gate electrode 225 as the material of spacers 229 and 231. Spacers 229 and 231 are formed on side walls of gate electrode 225 and gate insulation layer 223 by an etching process, such as an anisotropic etching process. In one embodiment, the oxide/nitride layer of spacers 229 and 231 may comprise an oxide layer made of tetra ethyl ortho silicate (TEOS) layer 229, and a nitride layer made of a silicon nitride layer 231.

Figure 3F:
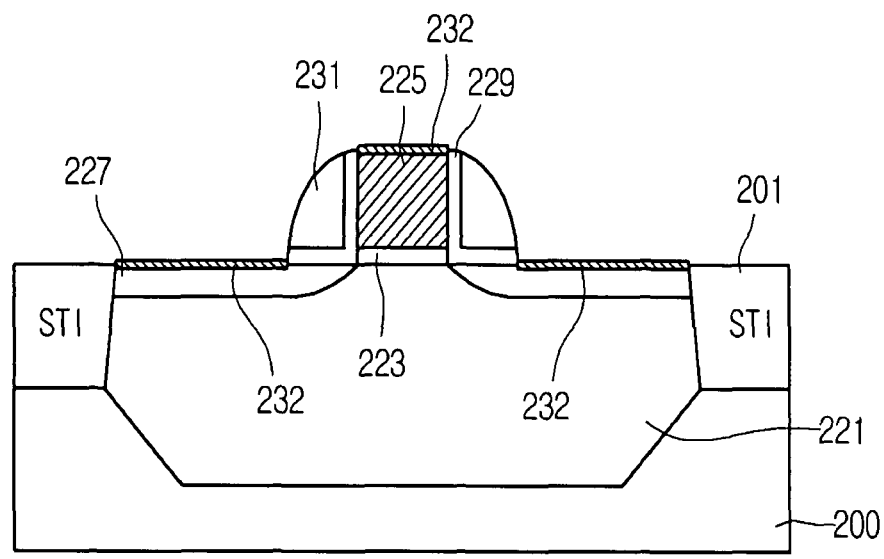

As shown in FIG. 3F, a thermal oxidation process may be performed on the entire surface of semiconductor substrate 200, so as to form a thermal oxide layer 232. In one embodiment, the thermal oxidation process may be a rapid thermal process (RTP). The RTP may be performed in an oxygen atmosphere at a temperature of about 700° C. to 800° C. As a result of the RTP, thermal oxide layer 232 is formed on the exposed gate electrode 225 and the exposed semiconductor substrate 200.

Figure 3G:
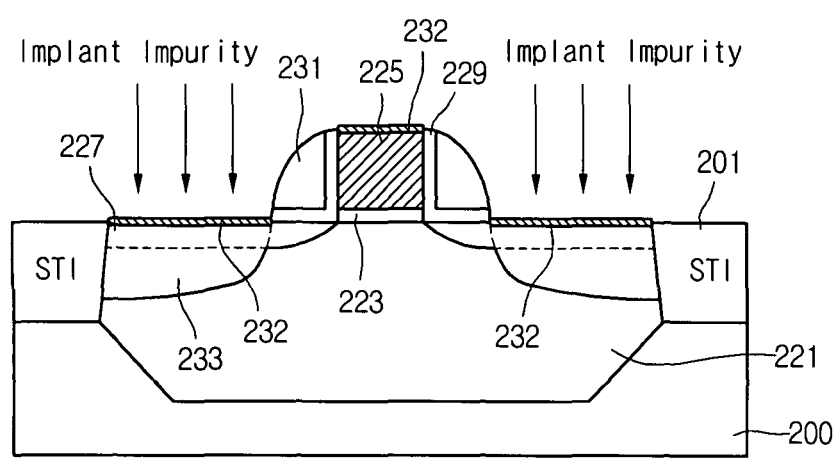

As shown in FIG. 3G, after forming thermal oxide layer 232 on semiconductor substrate 200, high density P type impurities are implanted in semiconductor substrate 200 using gate electrode 225 and spacers 229 and 231 as an implantation mask. As a result, a source/drain area 233 having a predetermined junction depth is formed at both sides of gate electrode 225 on semiconductor substrate 200. In one embodiment, the high density P type impurities may be 11 AMU Boron ions (11B+).

Figure 3H:
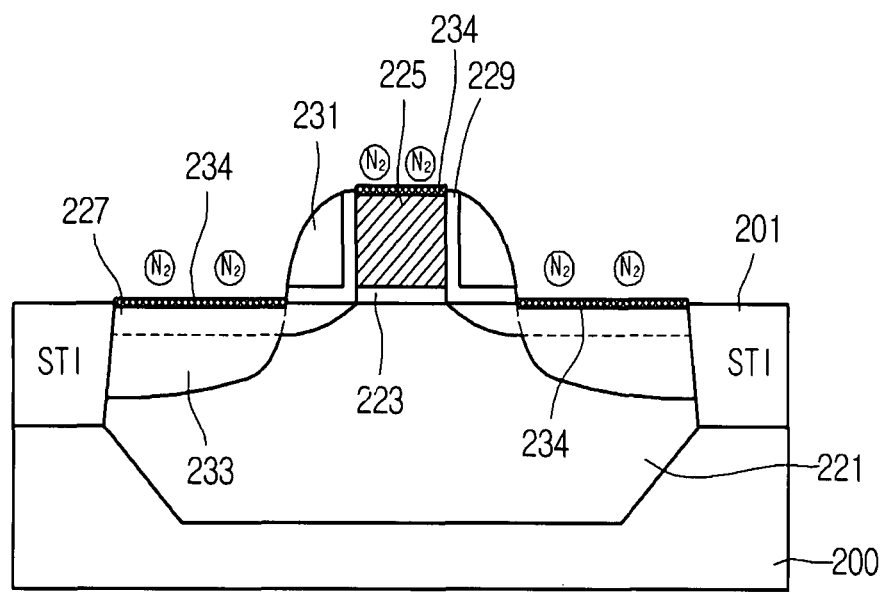

As shown in FIG. 3H, after source/drain area 233 is formed, an oxide-nitride layer 234 is formed by processing thermal oxide layer 232 through a nitrogen ($N_2$) plasma process on the entire surface of semiconductor substrate 200.

The nitrogen plasma process may be performed with predetermined conditions, such as a radio frequency (RF) power of about 150 W to 200 W, a nitride flow of about 350 sccm to 450 sccm, a pressure of about 9 torr to 22 torr, and a process time of about 100 sec to 120 sec.

Figure 3I:
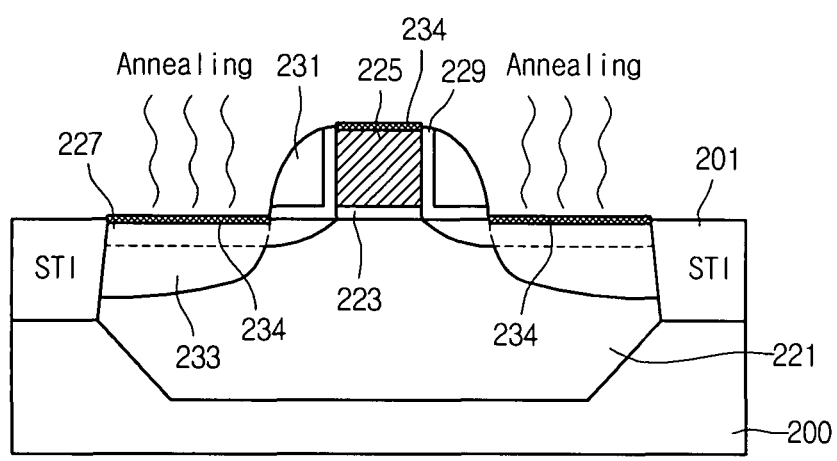

As shown in FIG. 3I, a spike annealing process is performed to activate impurities implanted in semiconductor substrate 200 to form source/drain area 233. The spike annealing process may be performed at a temperature of about 900~1100° C.

Since Boron (B) ions implanted in semiconductor substrate 200 has a high diffusivity, Boron ions may be out-diffused even if the ion implantation process is performed with a low ion implantation energy. However, oxide/nitride layer 234 formed on source/drain area 233 may operate as a barrier that prevents the Boron ions from out-diffused.

Accordingly, by preventing the impurities implanted in source/drain area 233 from being out-diffused, the PMOS transistor fabricated according to a method consistent with the present invention can sustain the impurity density of source/drain area 233 after the annealing process. Therefore, the PMOS transistor consistent with the present invention can retain its operation speed, and prevent its extension resistance from increasing, thereby improving the performance of the semiconductor device.

Although embodiments consistent with the present invention have been described, it should be understood that numerous other embodiments can be devised by those skilled in the art that will fall within the spirit and scope of the appended claims. More particularly, various variations and modifications are possible in the component parts and/or arrangements of the subject combination arrangement within the scope of the appended claims. In addition to variations and modifications in the component parts and/or arrangements, alternative uses will also be apparent to those skilled in the art.

What is claimed is:

1. A method for fabricating a semiconductor device, the method comprising:

forming a gate insulation layer and a gate electrode at predetermined areas of a semiconductor substrate;

forming low density impurity areas at both sides of the gate electrode on the semiconductor substrate;

forming a spacer at side walls of the gate insulation layer and the gate electrode, after forming the low density impurity areas;

forming a thermal oxide layer on an exposed portion of the semiconductor substrate, adjacent to the spacer without overlapping with the spacer, and on the gate electrode, after forming the spacer;

forming a source/drain area on the semiconductor substrate by implanting high density impurities at both sides of the gate electrode using the gate electrode and the spacer as an implantation mask, after forming the thermal oxide layer;

forming an oxide/nitride layer on the semiconductor substrate by processing the thermal oxide layer with an nitrogen plasma process; and performing an annealing process for activating the impurities of the source/drain area.

2. The method according to claim 1, wherein forming the thermal oxide layer comprises performing a rapid thermal process (RTP) in oxygen atmosphere at a temperature of about 700° C. to 800° C.

3. The method according to claim 1, wherein the impurities comprise Boron ions.

4. The method according to claim 3, wherein the Boron ions comprise 11 AMU (atomic mass unit) Boron ions.

5. The method according to claim 1, wherein the thermal oxide layer is formed on the gate electrode and on the source/drain area.

6. The method according to claim 1, wherein forming the oxide-nitride layer comprises performing the nitrogen plasma process under predetermined conditions including a radio frequency (RF) power of about 150 W to 200 W, a nitride flow of about 350 sccm to 450 sccm, a pressure of about 9 torr to 22 torr, and a process time of about 100 sec to 120 sec.

7. The method according to claim 1, wherein performing the annealing process comprises activating the impurities using a spike annealing process.

8. The method according to claim 7, wherein the spike annealing process is performed at a temperature of about 900° C. to 1100° C.

* * * * *